(12) United States Patent
Sleight et al.

(10) Patent No.: US 8,698,128 B2
(45) Date of Patent: Apr. 15, 2014

(54) GATE-ALL AROUND SEMICONDUCTOR NANOWIRE FET'S ON BULK SEMICODUCTOR WAFERS

(75) Inventors: Jeffrey W. Sleight, Ridgefield, CT (US); Josephine B. Chang, Mahopac, NY (US); Isaac Lauer, Yorktown Heights, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 13/405,682

(22) Filed: Feb. 27, 2012

(65) Prior Publication Data
US 2013/0221319 A1      Aug. 29, 2013

(51) Int. Cl.
*H01L 29/775* (2006.01)
(52) U.S. Cl.
USPC .................................. 257/24; 257/E21.309
(58) Field of Classification Search
USPC ............. 257/24, E21.309, E21.104; 977/762, 977/938
See application file for complete search history.

(56) References Cited

U.S. PATENT DOCUMENTS

| 7,560,358 | B1 | 7/2009 | Kim et al. |
| 7,892,945 | B2 | 2/2011 | Bedell et al. |
| 2010/0248454 | A1 | 9/2010 | Maszara et al. |
| 2011/0133167 | A1 | 6/2011 | Bangsaruntip et al. |
| 2012/0025313 | A1 | 2/2012 | Chang et al. |
| 2012/0329217 | A1* | 12/2012 | Bangsaruntip et al. ....... 438/157 |

FOREIGN PATENT DOCUMENTS

| KR | 10-20090055298 | 6/2009 |
| KR | 10-2010-0110727 | 10/2010 |

OTHER PUBLICATIONS

Kim, S., et al., "Silicon on Replacement Insulator (SRI) Floating Body Cell (FBC) Memory", 2010 Symposium on VLSI Technology Digest of Technical Papers, Jun. 15-17, 2010.
Bangsaruntip, S., et al., "High Performance and Highly Uniform Gate-All-Around Silicon Nanowire MOSFETs with Wire Size Dependent Scaling", Electron Devices Meeting (IEDM), 2009 IEEE International Issue Date: Dec. 7-9, 2009 on pp. 1-4.
U.S. Appl. No. 13/759,641 entitled "Pad-Less Gate-All Around Semiconductor Nanowire FET's on Bulk Semiconductor Wafers", filed Feb. 5, 2013.
U.S. Appl. No. 13/759,648 entitled "Two-Step Hydrogen Annealing Process for Creating Uniform Non-Planar Semiconductor Devices at Aggressive Pitch", filed Feb. 5, 2013.

(Continued)

*Primary Examiner* — Telly Green
(74) *Attorney, Agent, or Firm* — Scully, Scott, Murphy & Presser, P.C.; H. Daniel Schnurmann

(57) ABSTRACT

Non-planar semiconductor devices are provided that include at least one semiconductor nanowire suspended above a semiconductor oxide layer that is present on a first portion of a bulk semiconductor substrate. An end segment of the at least one semiconductor nanowire is attached to a first semiconductor pad region and another end segment of the at least one semiconductor nanowire is attached to a second semiconductor pad region. The first and second pad regions are located above and are in direct contact with a second portion of the bulk semiconductor substrate which is vertically offsets from the first portion. The structure further includes a gate surrounding a central portion of the at least one semiconductor nanowire, a source region located on a first side of the gate, and a drain region located on a second side of the gate which is opposite the first side of the gate.

17 Claims, 5 Drawing Sheets

(56) References Cited

OTHER PUBLICATIONS

Office Action dated Apr. 8, 2013 received in a related U.S. Patent Application, namely U.S. Appl. No. 13/759,636.

International Search Report/Written Opinion—US2013/026639; dated Jun. 14, 2013.

Office Action dated Jul. 8, 2013 received in a related U.S. Patent Application, namely U.S. Appl. No. 13/405,732.

* cited by examiner

GATE-ALL AROUND SEMICONDUCTOR NANOWIRE FET'S ON BULK SEMICODUCTOR WAFERS

BACKGROUND

The present disclosure relates to a semiconductor device and a method of forming the same. More particularly, the present disclosure relates to gate-all around semiconductor nanowire field effect transistors and a method of forming the same.

The use of non-planar semiconductor devices such as, for example, FinFETs, trigate and gate-all around semiconductor nanowire field effect transistors (FETs) is the next step in the evolution of complementary metal oxide semiconductor (CMOS) devices. The fabrication of such non-planar semiconductor devices typically occurs using a semiconductor-on-insulator (SOI) substrate which includes a handle substrate, a buried insulator layer located atop the handle substrate, and a semiconductor-on-insulator (SOI) layer located atop the buried insulator layer. Although SOI substrates have been used in forming non-planar semiconductor devices, the cost associated with SOI substrates is a main driver for efforts to form non-planar semiconductor devices on a bulk semiconductor substrate.

SUMMARY

The present disclosure provides a method in which non-planar semiconductor devices, i.e., gate-all around semiconductor nanowire FETs, are formed utilizing a bulk semiconductor substrate, instead of a SOI substrate. As such, the present disclosure provides a cost effect alternative for forming gate-all around semiconductor nanowire FETs.

In one aspect of the present disclosure, a non-planar semiconductor device is provided. The non-planar semiconductor device of the present disclosure includes at least one semiconductor nanowire suspended above a semiconductor oxide layer that is present on a first portion of a bulk semiconductor substrate. An end segment of the at least one suspended semiconductor nanowire is attached to a first semiconductor pad region and another end segment of the at least one suspended semiconductor nanowire is attached to a second semiconductor pad region. The first and second semiconductor pad regions are located above and are in direct contact with a second portion of the bulk semiconductor substrate. The second portion of the bulk semiconductor substrate is vertically offset and located above the first portion of the bulk semiconductor substrate. The semiconductor device of the present disclosure further includes a gate surrounding a central portion of the at least one suspended semiconductor nanowire, a source region located on a first side of the gate, and a drain region located on a second side of the gate which is opposite the first side of the gate.

In another aspect of the present disclosure, a method of fabricating a non-planar semiconductor device is provided. The method of the present disclosure includes forming at least one semiconductor wire region within a bulk semiconductor substrate. A sacrificial spacer is then provided on vertical sidewalls of the at least one semiconductor wire region. Portions of the bulk semiconductor substrate are then removed to provide an undercut beneath the sacrificial spacer and a vertical semiconductor pillar portion directly beneath the at least one semiconductor wire region. An oxidation process is then performed which converts a recessed surface of the bulk semiconductor substrate into a horizontal semiconductor oxide portion, while converting the vertical semiconductor pillar portion into a vertical semiconductor oxide pillar portion. At least the vertical semiconductor oxide pillar portion and the sacrificial spacer are thereafter removed forming at least one suspended semiconductor nanowire, while retaining at least a portion of the horizontal semiconductor oxide portion on the recessed surface of the bulk semiconductor substrate. In accordance with the present disclosure, the at least one suspended semiconductor nanowire has an end segment attached to a first semiconductor pad region and another end segment attached to a second semiconductor pad region, and the first and second semiconductor pad regions are located above and are in direct contact with a non-recessed surface of the bulk semiconductor substrate. Next, a hydrogen anneal is performed on the at least one suspended semiconductor nanowire. After performing the hydrogen anneal, a gate is provided surrounding a central portion of the at least one suspended semiconductor nanowire, and thereafter a source region and a drain region are formed on opposite sides of the gate.

DETAILED DESCRIPTION

Figure 1:
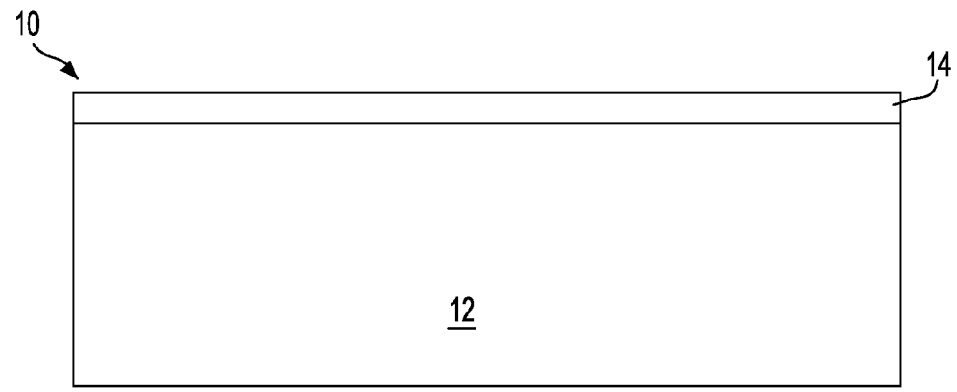
FIG. 1 is a pictorial representation (through a cross sectional view) illustrating an initial structure including a hard mask located atop a bulk semiconductor substrate that can be employed in one embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

In prior art processes, gate-all around semiconductor nanowire FETs are fabricated using a SOI substrate. Although SOI substrates have been used in forming non-planar semiconductor devices in prior art processes, the cost associated with SOI substrates is a main driver for efforts to form non-planar semiconductor devices on a bulk semiconductor substrate. The term "non-planar" as used to describe a semiconductor device denotes devices formed in regions other than the top layer of the substrate. The present disclosure thus provides a method in which gate-all around semiconductor nanowire FETs are formed on a bulk semiconductor substrate. As such, the method of the present disclosure provides a cost effect means for producing gate-all around semiconductor nanowire FETs without the need of using SOI substrates.

Referring now to FIG. 1, there is illustrated an initial structure 10 that can be employed in one embodiment of the present disclosure. The initial structure 10 includes a bulk semiconductor substrate 12 and a hard mask 14 located atop the bulk semiconductor substrate 12.

The term "bulk semiconductor substrate" as used throughout the present disclosure denotes a substrate in which the entirety of the substrate, e.g., extending from a bottommost surface to an uppermost surface and extending from one vertical edge to another vertical edge, is comprised of a semiconductor material. In a bulk semiconductor substrate, the semiconductor material is contiguously present in all directions without interruption therefore a non-semiconductor material, such as, for example, an insulator, is not present in the bulk semiconductor substrate that is employed in the present disclosure.

The bulk semiconductor substrate 12 that can be employed in the present disclosure includes a first semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the material of the bulk semiconductor substrate 12 can be a single crystalline, i.e., epitaxial, semiconductor material. The term "single crystalline" as used throughout the present disclosure denotes a material in which the crystal lattice of the entire sample is continuous and unbroken to the edges of the sample, with no grain boundaries. In one example, the bulk semiconductor substrate 12 can be a single crystalline silicon material. The thickness of the bulk semiconductor substrate 12 can be from 50 microns to 1 mm, although lesser and greater thicknesses can also be employed.

All or portions of the bulk semiconductor substrate 12 can be doped to provide at least one globally or locally conductive region (not shown) located beneath the interface between the uppermost surface of the bulk semiconductor substrate 12 and the overlying hard mask 14. The doping can be provided by ion implantation, gas phase doping or out-diffusion from a sacrificial material that includes a dopant. In one embodiment, an upper portion of the bulk semiconductor substrate 12 can be of a first conductivity type (i.e., n- or p-type), while a bottom portion of the bulk semiconductor substrate 12 can be of a second conductivity dopant (i.e., n- or p-type) that is opposite to the first conductivity type. The dopant concentration in the doped regions of the bulk semiconductor substrate 12 can be optimized for device performance. The formation of the upper and lower portion can be formed at this point of the present disclosure, or later on in the process including, for example, the formation of the source and drain regions.

The hard mask 14 that is located atop the bulk semiconductor substrate 12 of the initial structure 10 can be comprised of a dielectric hard mask material such as, for example, an oxide, nitride, and/or oxynitride. In one embodiment, the hard mask 14 is comprised of silicon oxide, a silicon nitride and/or a silicon oxynitride. In one embodiment, the hard mask 14 can be formed utilizing a thermal process such as, for example, a thermal oxidation or a thermal nitridation process. In another embodiment, the hard mask 14 can be formed by a deposition process such as, for example, chemical vapor deposition (CVD), and plasma enhanced chemical vapor deposition (PECVD). The thickness of the hard mask 14 can be from 5 nm to 50 nm, although lesser and greater thicknesses can also be employed.

Figure 2:
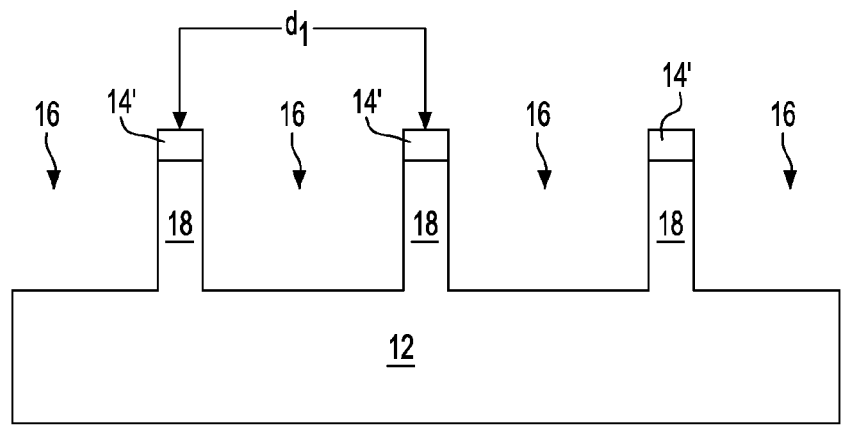
FIG. 2 is a pictorial representation (through a cross sectional view) illustrating the initial structure of FIG. 1 after patterning the bulk semiconductor substrate to include trench regions and semiconductor wire regions which are located adjacent the trench regions.

Referring now to FIG. 2, there is illustrated the initial structure 10 of FIG. 1 after patterning the bulk semiconductor substrate 12 to include trench regions 16 and semiconductor wire regions 18 which are located adjacent the trench regions 16. As is illustrated, each semiconductor wire region 18 that is formed is a vertically extending, contiguous portion of the bulk semiconductor substrate 12 and, as such, is composed of the same semiconductor material as the bulk semiconductor substrate 12. As is also shown, there is no interface and/or insulator material separating each semiconductor wire region 18 from the bulk semiconductor substrate 12 at this point of the present disclosure.

Each semiconductor wire region 18 that is formed, and as shown in FIG. 2, is capped by a remaining portion of the hard mask 14. The remaining portion of the hard mask 14 that is located atop each semiconductor wire region 18 can be referred to herein as a patterned hard mask 14'.

In one embodiment, the distance, $d_1$, between a center portion of each semiconductor wire region 18, i.e., pitch, is typically from 10 nm to 40 nm. In another embodiment, the distance between a center portion of each semiconductor wire region 18, i.e., pitch, is typically from 40 nm to 100 nm.

In one embodiment, the width of each of the semiconductor wire region 18, as measured from one vertical sidewall to another vertical sidewall is from 5 nm to 10 nm. In another embodiment, the width of each of the semiconductor wire region 18, as measured from one vertical sidewall to another vertical sidewall is from 10 nm to 30 nm.

The structure that is formed in FIG. 2 can be provided by utilizing a patterning process which includes lithography and etching. The lithographic step can include forming a photoresist (not shown) atop the hard mask 14, exposing the photoresist to a desired pattern, i.e., trench pattern, of radiation and then developing the exposed photoresist utilizing a conventional resist developer. The pattern within the photoresist is then transferred through the hard mask 14 and into the underlying bulk semiconductor substrate. A single etch or multiple etching can be used to provide the structure illustrated in FIG. 2. The etch or multiple etch can include a dry etch process, a chemical wet etch process, or any combination thereof. When a dry etch is used, the dry etch can be a reactive ion etch process, a plasma etch process, ion beam etching or laser ablation. The patterned photoresist material can be removed anytime after transferring the pattern into at least the hard mask 14 utilizing a conventional stripping process.

Each semiconductor wire region 18 that is formed at this point of the present disclosure has an end segment that is connected to a first semiconductor pad region and another end segment that is connected to a second semiconductor pad region. The first and second semiconductor pad regions are not shown in the cross sectional view of FIG. 2 since the pad regions go into and come out of the page in which FIG. 2 is illustrated.

Figure 3:
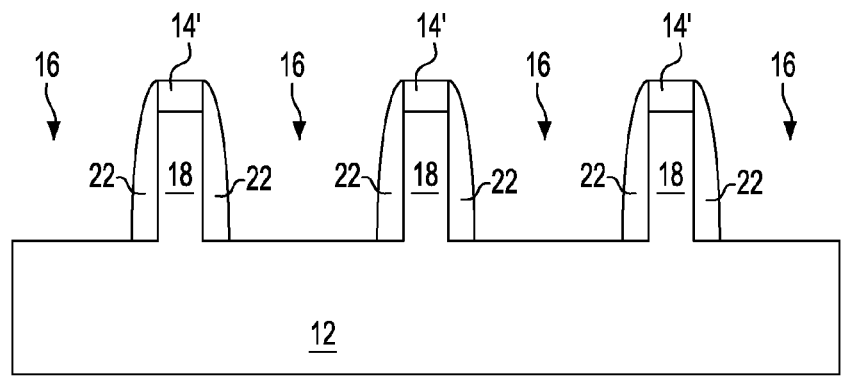
FIG. 3 is a pictorial representation (through a cross sectional view) illustrating the structure of FIG. 2 after formation of a sacrificial spacer on vertical sidewalls of each semiconductor wire region.

Referring now to FIG. 3, there is illustrated the structure of FIG. 2 after formation of a sacrificial spacer 22 on vertical sidewalls of each semiconductor wire region 18. The sacrificial spacer 22 can be comprised of a dielectric material including, for example, an oxide, a nitride, and/or an oxynitride. In one embodiment, the sacrificial spacer 22 is comprised of a same dielectric material as the hard mask 14. In another embodiment, the sacrificial spacer 22 is comprised of a dielectric material that differs from the dielectric material of the hard mask 14. A typical dielectric material for the sacrificial spacer 22 is silicon nitride.

The sacrificial spacer 22 can be formed by depositing a blanket dielectric film and then etching the dielectric film from all horizontal surfaces. In one embodiment, a reactive ion etch can be used in forming the sacrificial spacer 22. The width of each sacrificial spacer 22, as measured at its base, is from 2 nm to 15 nm.

Figure 4:
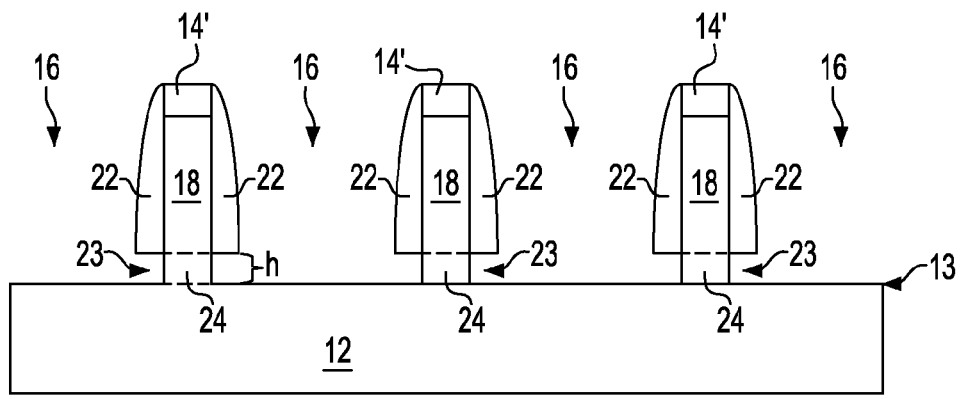
FIG. 4 is a pictorial representation (through a cross sectional view) illustrating the structure of FIG. 3 after performing a recess etch which provides an undercut beneath the sacrificial spacer that is present on the vertical sidewalls of each of the semiconductor wire regions.

Referring now to FIG. 4, there is illustrated the structure of FIG. 3 after performing a recess etch which provides an undercut 23 beneath the sacrificial spacer 22 that is present on the vertical sidewalls of each semiconductor wire region 18. Each undercut 23 has a width that is substantially the same as that of the width of the sacrificial spacer 22 mentioned above. The remaining portion of the bulk semiconductor substrate 12 that is located directly beneath each semiconductor wire region 18 and adjacent to the undercut 23 is referred to herein as a vertical semiconductor pillar portion 24 of the bulk semiconductor substrate 12. The vertical semiconductor pillar portion 24 extends from a horizontal recessed surface 13 of the bulk semiconductor substrate 12 to a bottom portion of each semiconductor wire region 18. The height, h, of the vertical semiconductor pillar portion 24, as measured from the vertical recessed surface 13 of the bulk semiconductor substrate 12 to the base of the semiconductor wire region 18 (and the base of the sacrificial spacer 22) is typically from 20 nm to 50 nm.

Figure 5:
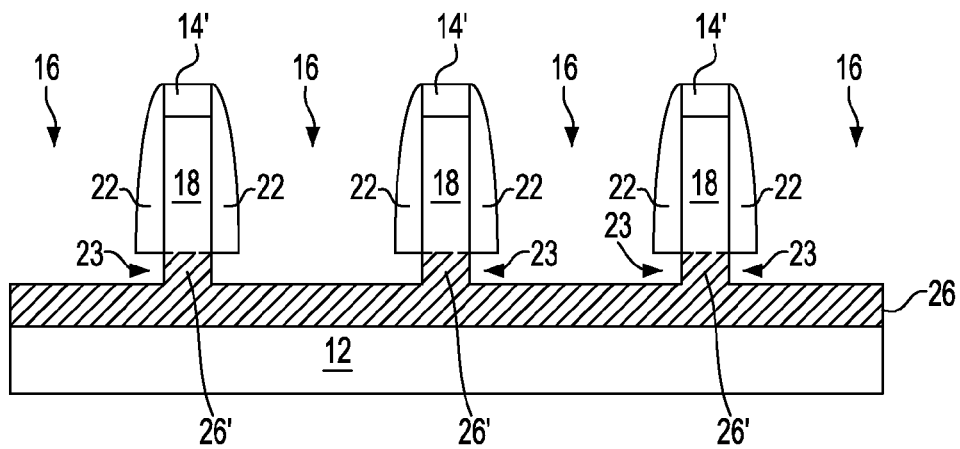
FIG. 5 is a pictorial representation (through a cross sectional view) illustrating the structure of FIG. 4 after performing an oxidation process which provides a semiconductor oxide layer to all exposed surfaces of the bulk semiconductor wafer including a vertical semiconductor pillar portion of the bulk semiconductor substrate that is located adjacent the undercut and beneath each semiconductor wire region.

Referring now to FIG. 5, there is illustrated the structure of FIG. 4 after performing an oxidation process which provides a semiconductor oxide layer to all exposed surfaces of the bulk semiconductor substrate 12 including the horizontal recessed surface 13 of the bulk semiconductor substrate 12 and each vertical semiconductor pillar portion 24. The semiconductor oxide layer that is formed on the horizontal recessed surface 13 of the bulk semiconductor substrate 12 is labeled as element 26 in the drawings and can be referred to as a horizontal semiconductor oxide portion. With respect to the vertical semiconductor pillar portion 24, the oxidation process consumes the entirety of the semiconductor material that is present in the vertical pillar portion 24 and converts the same into a vertical semiconductor oxide pillar portion 26'. The horizontal semiconductor oxide portion 26 and the vertical semiconductor oxide pillar portion 26' are contiguous oxide materials and collectively they form a semiconductor oxide layer in the structure. In one embodiment, the horizontal semiconductor oxide portion 26 and the vertical semiconductor oxide pillar portion 26' are comprised of a silicon oxide. It is noted that the semiconductor oxide layer, i.e., horizontal semiconductor oxide portion 26 and the vertical semiconductor oxide pillar portion 26', is an insulator material.

In one embodiment, the oxidation process that provides the horizontal semiconductor oxide portion 26 and the vertical semiconductor oxide pillar portion 26' is performed at a temperature of 700° C. or greater. In another embodiment of the present disclosure, the oxidation process that is used in providing the horizontal semiconductor oxide portion 26 and the vertical semiconductor oxide pillar portion 26' is performed at a temperature of from 700° C. to 1200° C. The oxidation process can be performed in any oxygen containing ambient including, for example, oxygen, air, and steam. In some embodiments, a single oxidation process can be performed to provide the structure shown in FIG. 5. In other embodiments, multiple oxidation processes can be performed.

Figure 6:
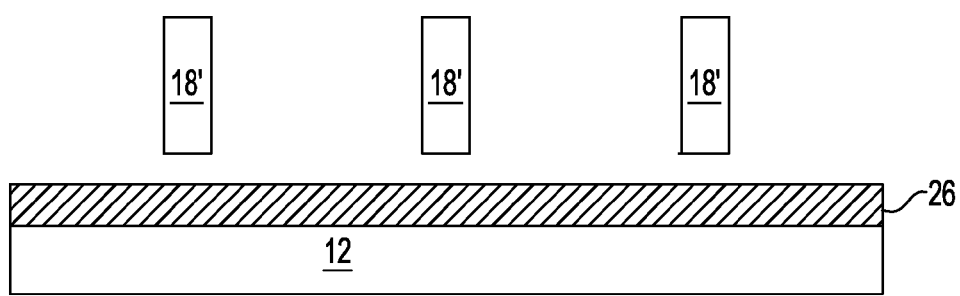
FIG. 6 is a pictorial representation (through a cross sectional view) illustrating the structure of FIG. 5 after removing at least the vertical semiconductor oxide pillar portion from the structure which provides suspended semiconductor nanowires having an end segment connected to a first semiconductor pad region and another end segment connected to a second semiconductor pad region.
Figure 7:
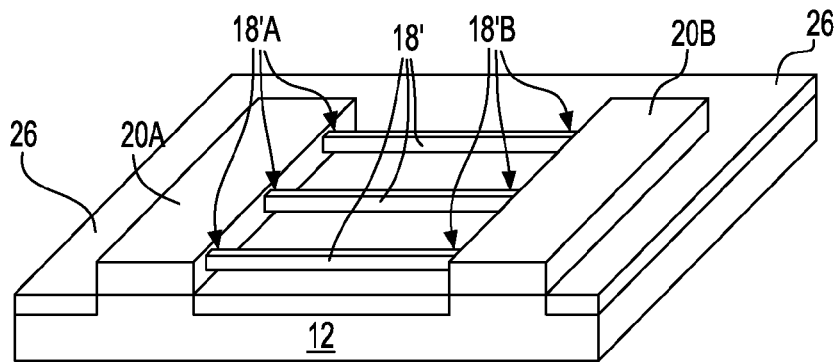
FIG. 7 is a perspective view of the structure shown in FIG. 6.

Referring now to FIGS. 6-7, there are illustrated the structure of FIG. 5 after removing at least the vertical semiconductor oxide pillar portion 26' from the structure which provides suspended semiconductor nanowires 18' having an end segment 18'A connected to a first semiconductor pad region 20A and another end segment 18'B connected to a second semiconductor pad region 20B. It is noted that the first and second semiconductor pad regions 20A, 20B are not shown in the cross sectional view of FIG. 6 since the pad regions 20, 20B go into and come out of the page in which FIG. 6 is illustrated.

During the removal process and because the horizontal semiconductor oxide portion 26 has a thickness that is greater than the thickness of the vertical semiconductor oxide pillar portion 26', the semiconductor oxide portion 26 is partially removed from the structure. In some embodiments, and during this removal process, the sacrificial spacer 22 is also removed from the structure. In other embodiments, the sacrificial spacer 22 can be removed prior to, or after, removing the at least vertical semiconductor oxide pillar portion 26' from the structure utilizing a separate etch than which is used in removing at least the vertical semiconductor oxide pillar portion 26' from the structure. In some embodiments of the present disclosure, the etch used in removing the vertical semiconductor oxide pillar portion 26' only partially removes the vertical semiconductor oxide pillar portion 26' and then oxidation and etching can be repeated to completely remove the vertical semiconductor oxide pillar portion 26' from the structure.

The removal of at least the vertical semiconductor oxide pillar portion 26' from the structure can be performed utilizing an anisotropic, i.e., directional, etching method. In one embodiment, the anisotropic etch comprises a diluted hydrofluoric acid (DHF). In one embodiment, a 100:1 DHF etches approximately 2 to 3 nm of a semiconductor oxide layer per minute at room temperature.

As is shown in FIG. 7, the first and second semiconductor pad regions (20A, 20B) are in direct contact with a non-recessed surface of a bulk semiconductor substrate 12. In prior art structures in which SOI substrates are used, the semiconductor pad regions would be located at least in part on an upper surface of a buried insulator layer of the SOI substrate.

In some embodiments in which the bulk semiconductor substrate was previously doped to include an upper portion of a first conductivity type (i.e., n- or p-type), and a bottom portion of a second conductivity type (i.e., n- or p-type) that is opposite to the first conductivity type of the upper portion, the first and second semiconductor pad regions (20A, 20B), which are formed in the upper portion of the bulk semiconductor substrate, would have the first conductivity, while the remaining bulk semiconductor material beneath the first and second semiconductor pad regions would be of a second conductivity type that is opposite the first conductivity. As such, the first and second semiconductor pad regions (20A, 20B) of the first conductivity type, are located atop and are in direct contact with a non-recessed surface of the bulk semiconductor substrate 12 that is of the second conductivity type. For example, the first and second semiconductor pad regions (20A, 20B) can be n-type doped, and can be located atop and can be in direct contact with a p-type bulk semiconductor material. In another example, the first and second semiconductor pad regions (20A, 20B) can be p-type doped, and can be located atop and can be in direct contact with an n-type bulk semiconductor material.

Figure 8:
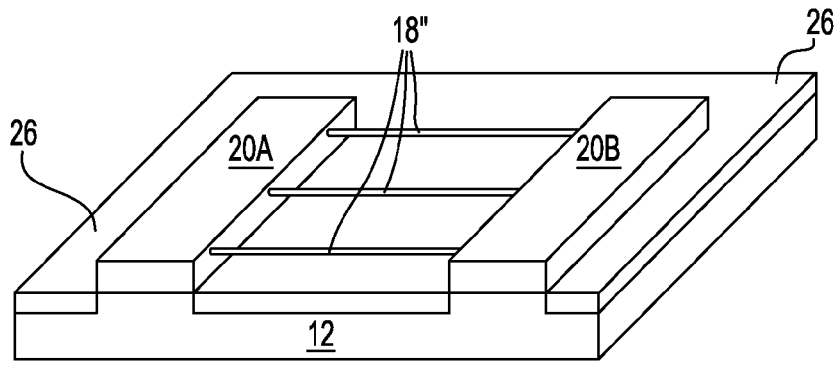
FIG. 8 is a perspective view of the structure shown in FIG. 7 after performing a hydrogen anneal which smoothes and reshapes each of the suspended semiconductor nanowires.

Referring to FIG. 8, there is shown the structure shown in FIGS. 6-7 after performing a hydrogen anneal which smoothes and reshapes each of the suspended semiconductor nanowires 18' forming elliptical shaped or cylindrical shaped suspended semiconductor nanowires 18". The elliptical shaped or cylindrical shaped suspended semiconductor nanowires 18" have a width that is less than the width of the suspended semiconductor nanowires 18' prior to performing the hydrogen anneal. The surface roughness of the elliptical shaped or cylindrical shaped suspended nanowires 18" is reduced as compared to the surface roughness of the suspended semiconductor nanowires 18' prior to performing the hydrogen anneal.

The hydrogen anneal employed in the present disclosure can be performed at a temperature from 600° C. to 1000° C. The pressure of hydrogen used during the hydrogen anneal can range from 7 torr to 600 torr.

In some embodiments, the shaped semiconductor nanowires 18" can be further thinned for additional critical dimension reduction. This further thinning step can be performed by subjecting the entirety of each of the shaped semiconductor nanowires 18" to a high temperature (greater than 700° C.) oxidation followed by etching of the grown oxide. The oxidation and etching can be repeated on the entirety of the at least one shaped semiconductor nanowires 18" to provide a desired critical dimension to the at least one shaped semiconductor nanowires 18".

Figure 9:
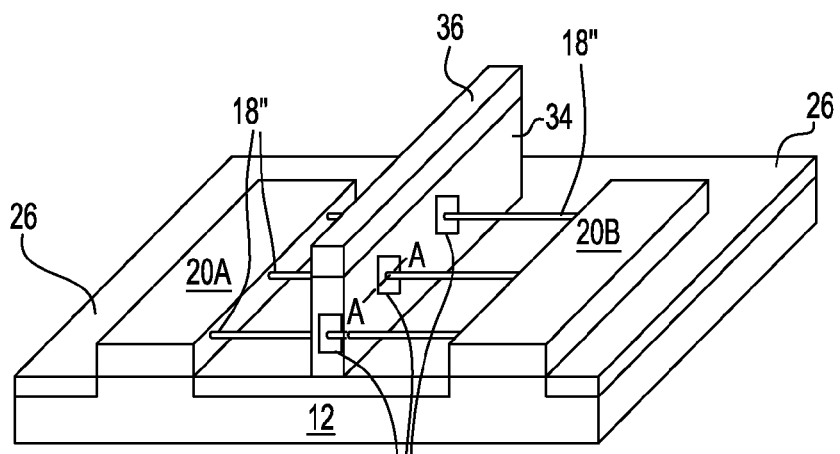
FIG. 9 is a perspective view of the structure shown in FIG. 8 after gate formation around a central portion of each of the suspended semiconductor nanowires which were subjected to the hydrogen anneal.
Figure 10:
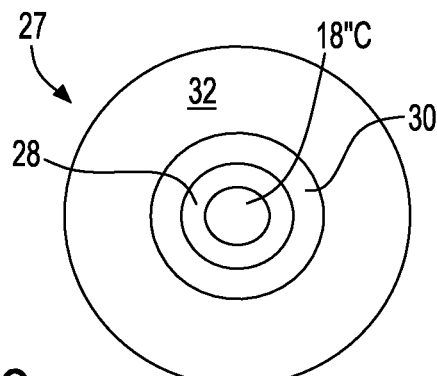
FIG. 10 is a cross sectional view of the gate along the line A-A shown in FIG. 9.

Referring now to FIGS. 9 and 10, there is shown the structure of FIG. 8 after gate formation around a central portion 18C" of the suspended at least one semiconductor nanowire 18" which was subjected to the hydrogen anneal. Specifically FIGS. 9-10 illustrate the structure of FIG. 8 after a gate 27 is formed surrounding a central portion 18C" of each semiconductor nanowire 18". More specifically, FIGS. 9-10 illustrate a structure in which the gate 27 fully wraps around the central portion 18C" of each semiconductor nanowire 18".

The structure shown in FIG. 9 also includes a polysilicon line 34 that caps each of the gates 27 and a hard mask line 36 that is located atop the polysilicon line 34. Although a single gate 27 is shown on each semiconductor nanowire 18", a plurality of gates 27 can be formed on each semiconductor nanowire 18".

The structure shown in FIG. 9 can be formed by first depositing blanket layers of the various material layers of gate 27 (to be described in greater detail herein below) on the entire structure shown in FIG. 8. Then, a blanket layer of polysilicon is formed atop the various layers of the gate 27, and thereafter a blanket layer of hard mask material is formed on the entire surface of the blanket layer of polysilicon. The entire material stack including the materials layers of the gate 27, the blanket layer of polysilicon, and blanket layer of hard mask material, is then patterned by lithography and etching providing the structure shown in FIG. 9. The etch used in forming the structure shown in FIG. 9 may comprise a dry etching process such as, for example, reactive ion etching, plasma etching, or ion beam etching.

Each gate 27, as shown, for example, in FIG. 10, may comprise a first dielectric material 28, an optional second dielectric material 30, and a metal gate film 32. It is noted that the central portion 18C" of the at least one semiconductor nanowire 18" that is directly beneath the gate 27 serves as a channel of the semiconductor nanowire FET of the present disclosure. The channel 18C" of the semiconductor nanowire channel FETs of the present disclosure forms at a surface of a portion of the at least one semiconductor nanowire 18" that is under the gate (or in the bulk of the nanowire when the nanowire has a diameter smaller than 5 nm). Since the gate 27 fully surrounds the at least one semiconductor nanowire 18", the non-planar semiconductor device of the present disclosure can be referred to as a gate-all-around FET.

The first dielectric material 28 may comprise a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The first dielectric material 28 can be formed by any conventional technique including, for example, deposition or thermal growth, which is well known to those skilled in the art. In one embodiment of the present disclosure, the first dielectric material 28 has a thickness in a range from 1 nm to 10 nm.

The optional second dielectric material 30 may comprise one of the dielectric materials mentioned above for the first dielectric material 28. In one embodiment, the optional second dielectric material 30 is comprised of a same dielectric material as the first dielectric material 28. In another embodiment, the optional second dielectric material 30 is comprised of a different dielectric material as the first dielectric material 28. For example, and in this embodiment, the first dielectric material 28 may comprise silicon oxide, while the optional second dielectric material 30 may comprise a high k gate dielectric such as, for example, $HfO_2$. The optional second dielectric material 30 can be formed utilizing one of the techniques mentioned above in forming the first dielectric material 28. In one embodiment, the thickness of the optional second dielectric 30 may be in a range from 1 nm to 3 nm.

The metal gate film 32 that is formed may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The metal gate film 32 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the metal gate film 32 has a thickness from 1 nm to 100 nm.

As stated above, a blanket layer of polysilicon is then formed atop the metal gate film 32 utilizing techniques well known in the art. The blanket layer of polysilicon which is subsequently patterned into polysilicon line 34 can be doped within an appropriate impurity by utilizing either an in-situ doping deposition process or by utilizing deposition, followed by a step such as ion implantation or gas phase doping in which the appropriate impurity is introduced into the blanket layer of polysilicon.

After forming the blanket layer of polysilicon, a blanket layer of a hard mask material is formed atop the blanket layer of polysilicon. The hard mask material may comprise a semiconductor oxide, a semiconductor nitride, a semiconductor oxynitride or any multilayered stack thereof can be used. In one embodiment, the hard mask material employed is silicon nitride. The blanket layer of hard mask material can be formed utilizing any conventional deposition process or thermal growth process that is well known to those skilled in the art.

Figure 11:
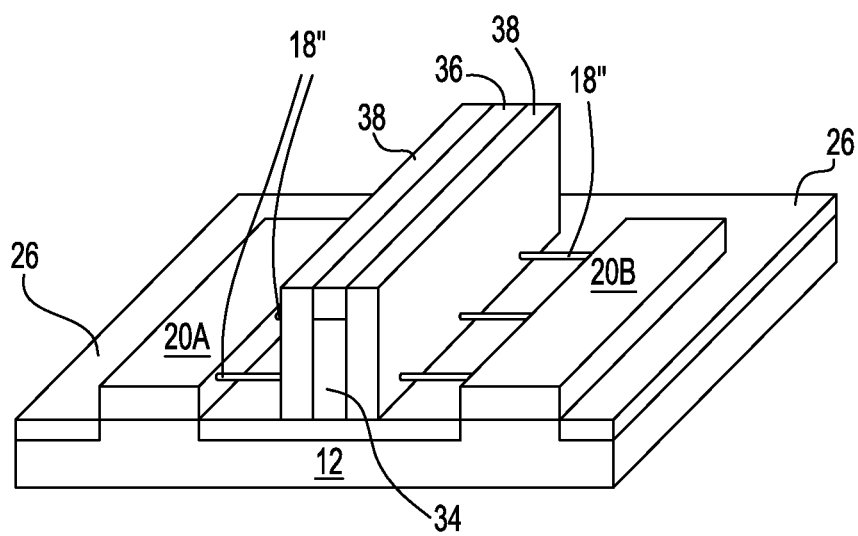
FIG. 11 is a perspective view of the structure shown in FIG. 10 after spacer formation.

Referring to FIG. 11, there is illustrated the structure of FIG. 9 after spacer 38 formation. As is shown, the spacer 38 is formed on opposing sides of the polysilicon line 34 and on portions of each semiconductor nanowire 18" that are not covered by the gate. The spacer 38 can be formed by depositing a blanket dielectric film such as silicon nitride and then etching the dielectric film from all horizontal surfaces. In one embodiment, a reactive ion etch can be used in forming the spacer 38.

Figure 12:
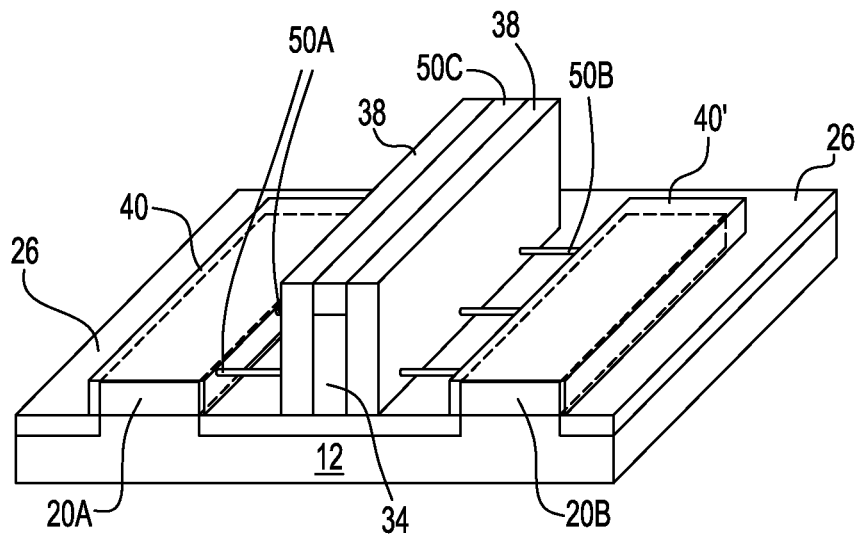
FIG. 12 is a perspective view of the structure shown in FIG. 10 after formation of a source region and a drain region.

Referring to FIG. 12, there is illustrated the structure of FIG. 11 after formation of a source region on one side of the gate and a drain region on the other side of the gate. The source and drain regions are formed by a selective epitaxial growth process that thickens the exposed semiconductor nanowire 18" surfaces forming a first thickened semiconductor nanowire portion 50A and a second thickened semiconductor nanowire portion 50B which are not covered by the gate and spacers. The epitaxial growth also thickens the semiconductor pad regions 20A, 20B. In some embodiments, the hard mask line 36 is removed from the polysilicon line 34 prior to selective epitaxial growth utilizing a conventional stripping process. In such an embodiment and as shown in FIG. 12, an epitaxial semiconductor layer 50C forms atop the polysilicon line 34.

In the drawing, reference numeral 40 denotes the epitaxial semiconductor layer that is formed atop the first pad region 20A, while numeral 40' denotes the epitaxial semiconductor layer that is formed atop the first pad region 20B. In accordance with the present disclosure the source region includes epitaxial semiconductor layer 40 as well as the first thickened semiconductor nanowire portion 50A, while the drain region includes epitaxial semiconductor layer 40' as well as the second thickened semiconductor nanowire portion 50B.

The epitaxial growth may merge the adjacent semiconductor portions together. In one embodiment, the thickened/merged nanowire portions 50A, 50B and semiconductor pad regions 20A, 20B are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCl. The use of chlorine allows selective deposition of silicon only on exposed silicon surfaces. A precursor for SiGe may be $GeH_4$, which may obtain deposition selectivity without HCl. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

In some embodiments, and if not previously down, the pad regions 20A and 20B can now be doped to be of a conductivity type which different from the conductivity type of the remaining bulk semiconductor substrate 12. This can be achieved by ion implantation, or by diffusing the dopant from the epitaxial layers 40 and 40' into the pad regions 20A, 20B by annealing at a temperature of greater than 800° C.

Figure 13:
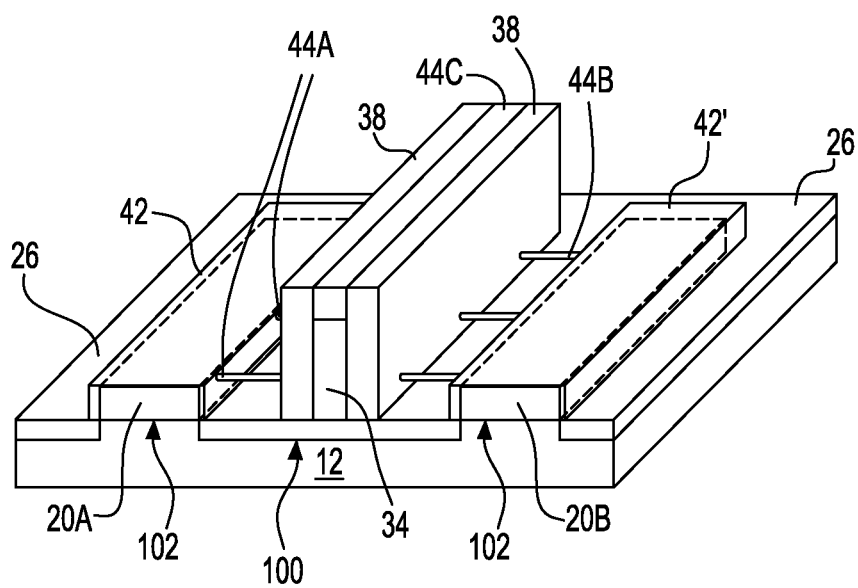
FIG. 13 is a perspective view of the structure shown in FIG. 12 after formation of a metal semiconductor alloy layer atop the source region and the drain region.

Referring to FIG. 13, there is illustrated the structure shown in FIG. 12 after formation of a metal semiconductor alloy layer atop the source region and the drain region. The metal semiconductor alloy layer can be formed by first depositing a metal semiconductor alloy forming metal such as for example, Ni, Pt, Co, and alloys such as NiPt, on the surface of the epitaxial grown semiconductor layer including layers 50A, 50B, 50C, 40 and 40'. An anneal is then performed that causes reaction between the metal semiconductor alloy forming metal and the epitaxial semiconductor layer. After annealing, any unreactive metal can be removed. When Ni is used the NiSi phase is formed due to its low resistivity. For example, formation temperatures include 400° C.-600° C.

In the drawing, reference numerals 42 and 42' denote a metal semiconductor alloy that is formed atop the first and second semiconductor pads 20A and 20B, respectively, reference numeral 44A denotes the metal semiconductor alloy that is formed on the first thickened semiconductor nanowire portion 50A, and reference numeral 44B denotes the metal semiconductor alloy that is formed on the second thickened semiconductor nanowire portion 50B. In embodiments in which the hard mask line 36 was removed, a metal semiconductor alloy layer 44C can form atop the polysilicon line 34, as is shown in FIG. 13.

Once the metal semiconductor alloy layer is formed, capping layers and vias for connectivity (not shown) may be formed.

The method of the present disclosure provides a non-planar semiconductor device such as shown, for example, in the various drawings of the present disclosure. The non-planar semiconductor device includes at least one semiconductor nanowire 18" suspended above a semiconductor oxide layer 26 that is present on a first portion 100 of a bulk semiconductor substrate 12, wherein an end segment of the at least one suspended semiconductor nanowire 18" is attached to a first semiconductor pad region 20A and another end segment of said at least one suspended semiconductor nanowire 18" is attached to a second semiconductor pad region 20B. The first and second semiconductor pad regions (20A, 20B) are located above and are in direct contact with a second portion 102 of the bulk semiconductor substrate 12. The second portion 102 of the bulk semiconductor substrate 12 is vertically offset and located above the first portion 100 of the bulk semiconductor substrate 12. The device further includes a gate 27 surrounding a central portion 18"C of the at least one suspended semiconductor nanowire 18", a source region (epitaxial semiconductor layers 40, 50A) located on a first side of the gate 27, and a drain region (epitaxial semiconductor layers 40', 50B) located on a second side of the gate 27 which is opposite the first side of the gate. The second portion 102 of the bulk semiconductor substrate 12 may be referred to herein as a non-recessed surface.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A non-planar semiconductor device comprising:
    at least one semiconductor nanowire suspended above a semiconductor oxide layer that is present on a first single crystalline semiconductor material portion of a bulk semiconductor substrate, wherein an end segment of said at least one suspended semiconductor nanowire is attached to a first semiconductor pad region and another end segment of said at least one suspended semiconductor nanowire is attached to a second semiconductor pad region, wherein an entirety of a bottommost surface of each of said first and second semiconductor pad regions is in direct physical contact with a second single crystalline semiconductor material portion of the bulk semiconductor substrate, said second single crystalline semiconductor material portion of the bulk semiconductor substrate is vertically offset and located above said first single crystalline semiconductor material portion of the bulk semiconductor substrate;
    a gate surrounding a central portion of said at least one suspended semiconductor nanowire;
    a source region located on a first side of the gate; and
    a drain region located on a second side of the gate which is opposite said first side of the gate.

2. The non-planar semiconductor device of claim 1, further comprising a spacer located on each side of the gate.

3. The non-planar semiconductor device of claim 1, wherein said source region and said drain region comprise an epitaxial semiconductor material located on said first and second semiconductor pad regions, and exposed surfaces of the at least one suspended semiconductor nanowire.

4. The non-planar semiconductor device of claim 1, wherein a metal semiconductor alloy material is located on said source region and said drain region.

5. The non-planar semiconductor device of claim 1, wherein said gate comprises a gate stack including at least one gate dielectric material and a metal gate film located on the at least one gate dielectric material.

6. The non-planar semiconductor device of claim 1, wherein said at least one suspended semiconductor nanowire is elliptical shaped.

7. The non-planar semiconductor device of claim 1, further comprising a polysilicon line atop the gate, said polysilicon line is orientated perpendicular to the at least one suspended semiconductor nanowire.

8. The non-planar semiconductor device of claim 7, further comprising a metal semiconductor alloy atop said polysilicon line.

9. The non-planar semiconductor device of claim 1, wherein said first and second semiconductor pad regions are of a first conductivity type, and said bulk semiconductor substrate is of a second conductivity type, wherein said first conductivity type is different from said second conductivity type.

10. The non-planar semiconductor device of claim 1, wherein said at least one suspended semiconductor nanowire comprises a plurality of suspended semiconductor nanowires which are oriented parallel to each other.

11. The non-planar semiconductor device of claim 1, wherein said at least one suspended semiconductor nanowire is cylindrical shaped.

12. The non-planar semiconductor device of claim 5, wherein said at least one gate dielectric comprises a first dielectric material and a second dielectric material, wherein said first dielectric material is a same dielectric material as said second dielectric material.

13. The non-planar semiconductor device of claim 5, wherein said at least one gate dielectric comprises a first dielectric material and a second dielectric material, wherein said first dielectric material is a different dielectric material as said second dielectric material.

14. The non-planar semiconductor device of claim 1, wherein said at least one semiconductor nanowire and said bulk semiconductor substrate comprise a same semiconductor material.

15. The non-planar semiconductor device of claim 14, wherein said at least one semiconductor nanowire and said bulk semiconductor substrate comprise a single crystalline semiconductor material.

16. A non-planar semiconductor device comprising:
    at least one semiconductor nanowire suspended above a semiconductor oxide layer that is present on a first single crystalline semiconductor material portion of a bulk semiconductor substrate, wherein an end segment of said at least one suspended semiconductor nanowire is attached to a first semiconductor pad region and another end segment of said at least one suspended semiconductor nanowire is attached to a second semiconductor pad region, wherein an entirety of a bottommost surface of each said first and second semiconductor pad regions is in direct physical contact with a second single crystalline semiconductor material portion of the bulk semiconductor substrate, said second single crystalline semiconductor material portion of the bulk semiconductor substrate is vertically offset and located above said first single crystalline semiconductor material portion of the bulk semiconductor substrate;
    a gate surrounding a central portion of said at least one suspended semiconductor nanowire;
    a source region located on a first side of the gate;
    a drain region located on a second side of the gate which is opposite said first side of the gate; and
    a spacer located on each side of the gate, wherein said source region and said drain region comprise an epitaxial semiconductor material located on said first and second semiconductor pad regions, and exposed surfaces of the at least one suspended semiconductor nanowire, and wherein a metal semiconductor alloy material is located on said source region and said drain region.

17. A non-planar semiconductor device comprising:
    at least one semiconductor nanowire suspended above a semiconductor oxide layer that is present on a first portion of a bulk semiconductor substrate, wherein an end segment of said at least one suspended semiconductor nanowire is attached to a first semiconductor pad region and another end segment of said at least one suspended semiconductor nanowire is attached to a second semiconductor pad region, said first and second semiconductor pad regions are located above and are in direct contact with a second portion of the bulk semiconductor substrate, said second portion of the bulk semiconductor substrate is vertically offset and located above said first portion of the bulk semiconductor substrate;

a gate surrounding a central portion of said at least one suspended semiconductor nanowire;

a polysilicon line atop the gate, said polysilicon line is orientated perpendicular to the at least one suspended semiconductor nanowire;

a metal semiconductor alloy atop said polysilicon line;

a source region located on a first side of the gate; and a drain region located on a second side of the gate which is opposite said first side of the gate.

* * * * *